(12) United States Patent
Moon et al.

(10) Patent No.: US 7,071,506 B2
(45) Date of Patent: Jul. 4, 2006

(54) DEVICE FOR INHIBITING HYDROGEN DAMAGE IN FERROELECTRIC CAPACITOR DEVICES

(75) Inventors: Bum-Ki Moon, Tokyo-to (JP); Karl Hornik, Kanagawa-ken (JP); Haoren Zhuang, Tokyo-to (JP); Ulrich Egger, Kanagawa-ken (JP); Jenny Lian, Wallkill, NY (US); Andreas Hilliger, Kanagawa-ken (JP)

(73) Assignee: Infineon Technologies AG, Munich (DE)

( * ) Notice: Subject to any disclaimer, the term of this patent is extended or adjusted under 35 U.S.C. 154(b) by 131 days.

(21) Appl. No.: 10/655,757

(22) Filed: Sep. 5, 2003

(65) Prior Publication Data

US 2005/0051819 A1 Mar. 10, 2005

(51) Int. Cl.
*H01L 29/76* (2006.01)

(52) U.S. Cl. .................................. 257/295; 257/296

(58) Field of Classification Search ............... 257/295, 257/296, 17, 71, 100, 305, 306, 767
See application file for complete search history.

(56) References Cited

U.S. PATENT DOCUMENTS

| | | | |
|---|---|---|---|
| 6,066,868 A | * | 5/2000 | Evans, Jr. ................ 257/295 |
| 6,492,222 B1 | * | 12/2002 | Xing ........................ 438/240 |
| 6,509,601 B1 | | 1/2003 | Lee et al. |
| 6,740,531 B1 | * | 5/2004 | Cho et al. ................... 438/3 |
| 2002/0021544 A1 | | 2/2002 | Cho et al. |
| 2002/0025592 A1 | | 2/2002 | Schindler et al. |
| 2003/0136989 A1 | | 7/2003 | Amiotti et al. |
| 2003/0234412 A1 | | 12/2003 | Yamanobe |
| 2004/0057193 A1 | | 3/2004 | Moon et al. |

FOREIGN PATENT DOCUMENTS

JP 411087633 A * 3/1999

* cited by examiner

*Primary Examiner*—David Nelms
*Assistant Examiner*—Thinh T Nguyen
(74) *Attorney, Agent, or Firm*—Fish & Richardson P.C.

(57) ABSTRACT

A ferroelectric capacitor device comprises a substrate, a contact plug passing through the substrate, a first electrode formed on the substrate, the first electrode being electrically connected to said plug, a ferroelectric layer formed on the first electrode, a second electrode formed on the ferroelectric layer, one or more first encapsulation layers on the second electrode, the encapsulation layers extending over the device, and one or more hydrogen storage material layers on the encapsulation layers. One or more second encapsulation layers may be formed on the one or more hydrogen storage material layers.

11 Claims, 2 Drawing Sheets

Enhancement using encapsulation layer (2) on a stacked layers of hydrogen storage layer/encapsulation layer (1).
STEP-3

Hydrogen diffusion during p-TEOS depo. for ILD

Deposition of encapsulation layer
using sputter, Al2O3, TiO2, CeO2, etc.:
STEP-1

Deposition of hydrogen storage material on 1st-encapsulation layer;
STEP-2

Enhancement using encapsulation layer (2) on a stacked layers of hydrogen storage layer/encapsulation layer (1).
STEP-3

DEVICE FOR INHIBITING HYDROGEN DAMAGE IN FERROELECTRIC CAPACITOR DEVICES

FIELD OF THE INVENTION

The present invention relates to methods and systems for inhibiting hydrogen damage in, for example, ferroelectric capacitor devices.

BACKGROUND OF THE INVENTION

A conventional integrated ferroelectric capacitor includes one or more ferroelectric layers sandwiched between a bottom electrode and a top electrode. The ferroelectric layer(s) may include, for example, PZT, SBT or BLT. The capacitor is covered with one or more interlayer dielectric layers, normally Tetraethyl Orthosilicate (TEOS), and connection to the top electrode is achieved by etching a window through the interlayer dielectric layer(s) and filling the window with a metal filler. The bottom electrode is mounted on a substrate, the electrical connection to the bottom electrode being via a metal plug through the substrate. To make the connection between the bottom electrode and the plug, a window is formed through the interlayer dielectric layer(s), through the other layers of the capacitor and into the plug. A liner is formed in this window and a metal filler is deposited in the bottom of the window to make the contact between the bottom electrode and the plug. The liner and the metal filler are etched to leave just the contact to the plug. Encapsulation layers and cover layers are added to protect the resultant capacitor.

Conventional integrated ferroelectric Random Access Memories (FeRAMs) including one or more of the above types of capacitors generally suffer from a number of problems. These problems are predominantly due to hydrogen damage generated during the backend process of application of the intermetal dielectric layer and deposition of the encapsulation and/or cover layers. Processes such as plasma-Tetraethyl Orthosilicate (p-TEOS) deposition which is used to apply the one or more interlayer dielectric layers to the capacitor, RIE (reactive ion etch), and sintering are known to damage the capacitor due to the reducing effects of the hydrogen released. Furthermore, processes such as plasma-enhanced chemical vapour deposition (PECVD) which uses $SiH_4$-based gas chemistry, generate hydrogen ions and electrons which can diffuse into the ferroelectric layer of the capacitor and then pin ferroelectric domains. The hydrogen ions and electrons may also cause decomposition of the ferroelectric layer as well as decomposition of electrode materials, such as SRO. These types of effects can lead to serious degradation of the ferroelectric performance of the capacitor. The damaged capacitors have more defects resulting in more space charge formation and their ferroelectric properties degrade.

Conventional attempts to reduce the hydrogen diffusion in capacitors include the deposition of several layers of encapsulant and cover layers over the capacitor, usually by a sputtering process or atomic layer deposition (ALD). These layers are typically formed of $Al_2O_3$, but it is also known to use other oxides such as $TiO_x$. Such conventional techniques have limited success as the encapsulant and cover layers are insufficient to prevent hydrogen diffusion.

Other attempts have been made to reduce the effect of hydrogen on the capacitor, for example, by burying or recessing the bottom electrode in the substrate, however, these have not been found to be effective in preventing hydrogen damage.

In view of the foregoing problems with conventional processes and devices, a need exists for a method for inhibiting hydrogen damage during the manufacture of a capacitor.

SUMMARY OF THE INVENTION

In general terms, the present invention propose that one or more layers of hydrogen storage material be applied to the encapsulant and/or cover layers of the capacitor. By covering the encapsulant and/or cover layers with such a material, hydrogen diffusion into the ferroelectric layer can be inhibited. This is considered particularly advantageous as damage to the capacitor from hydrogen diffusion during processing may thereby be avoided or reduced.

According to a first aspect of the present invention there is provided a device comprising:

a substrate;

a contact plug passing through said substrate;

a first electrode formed on said substrate, said first electrode being electrically connected to said plug;

a ferroelectric layer formed on said first electrode;

a second electrode formed on said ferroelectric layer;

one or more first encapsulation layers on said second electrode, said one or more encapsulation layers extending over said device; and one or more hydrogen storage material layers on said one or more encapsulation layers.

Preferably, the device further comprises one or more second encapsulation layers formed on said one or more hydrogen storage material layers to provide further protection against hydrogen damage.

According to a second aspect of the present invention there is provided a method for fabricating a device having a substrate, a contact plug through the substrate, a first electrode on said substrate, a ferroelectric layer on said first electrode, a second electrode on said ferroelectric layer, and one or more first encapsulation layers on said second electrode extending over said device, the method comprising the step of:

forming one or more layers of hydrogen storage material on said one or more first encapsulation layers.

According to a third aspect of the present invention there is provided a ferroelectric capacitor device comprising the device defined above.

According to a fourth aspect of the present invention there is provided a device formed according to the method defined above.

According to a fifth aspect of the present invention there is provided a ferroelectric Random Access Memory device comprising one or more of the devices defined above.

BRIEF DESCRIPTION OF THE FIGURES

Preferred features of the invention will now be described, for the sake of illustration only, with reference to the following Figures in which:

FIG. 2b is a schematic cross-sectional view of a capacitor according to an embodiment of the present invention showing application of a hydrogen storage material to the encapsulation layers shown in FIG. 2a.

DETAILED DESCRIPTION OF PREFERRED EMBODIMENTS

Figure 1:
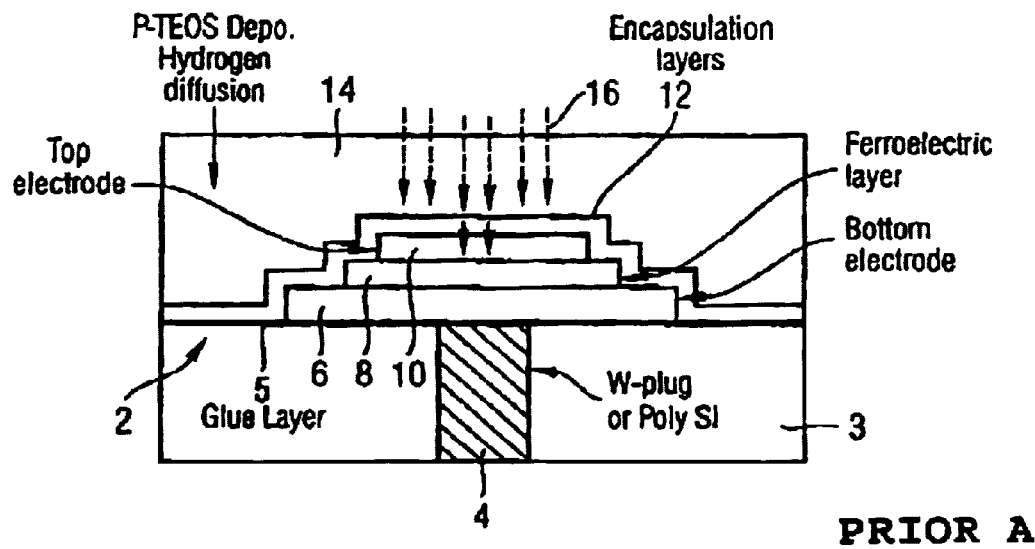
FIG. 1 is a schematic cross-sectional view of a conventional capacitor showing hydrogen diffusion occurring during plasma-TEOS deposition to create an interlayer dielectric layer of the capacitor.

Conventional ferroelectric capacitors 2 such as that shown schematically in FIG. 1, comprise a substrate 3, a contact plug 4 extending through the substrate 3, a glue layer 5 applied to the substrate 3, a bottom electrode 6 on said glue layer 5, a ferroelectric layer 8 of material, such as PZT, on said bottom electrode 6, and a top electrode 10 on said ferroelectric layer 8. One or more encapsulation layers 12 cover the capacitor 2. The plug 4 may be formed of, for example, tungsten or polysilicon.

The capacitor is covered with one or more interlayer dielectric layers 14, normally plasma-Tetraethyl Orthosilicate (p-TEOS), and connection to the top electric is achieved by etching a window (not shown) through the interlayer dielectric layer(s) 14 and filling the window with a metal filler (not shown). During the deposition of the p-TEOS layer(s) 14, hydrogen ions 16 are released which diffuse through the encapsulation layer(s) 12, into the top electrode 10 and the ferroelectric layer 8 causing damage thereto.

The hydrogen ions are generated during the p-TEOS process due to the decomposition of the TEOS. These hydrogen ions could diffuse through the encapsulated sidewalls 17 of the ferroelectric layer 8 causing damage thereto.

Figure 2A:
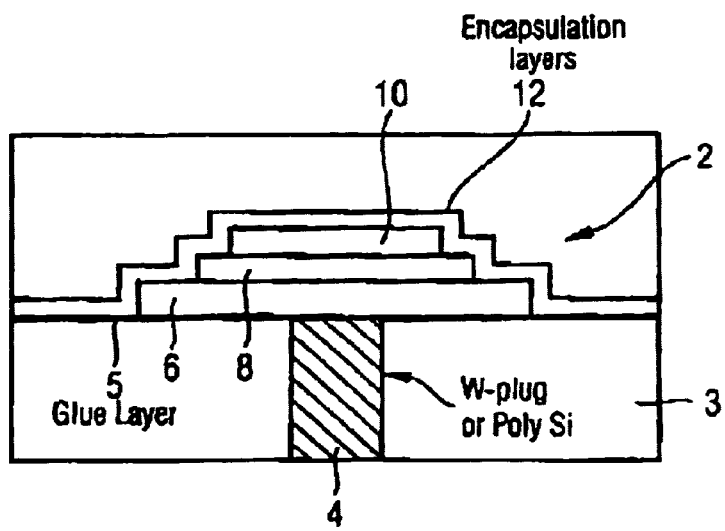
FIG. 2a is a schematic cross-sectional view of a capacitor according to an embodiment of the present invention showing encapsulation layers over the capacitor.
Figure 2B:
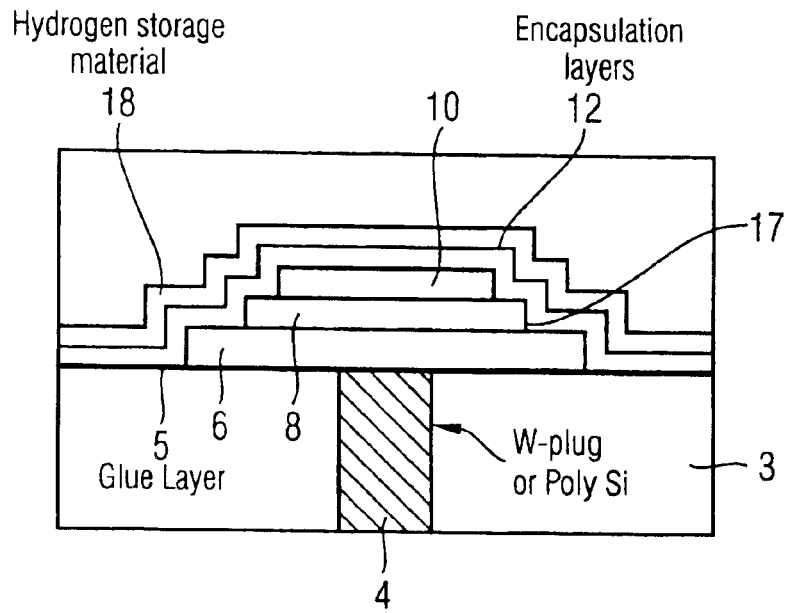
Figure 3:
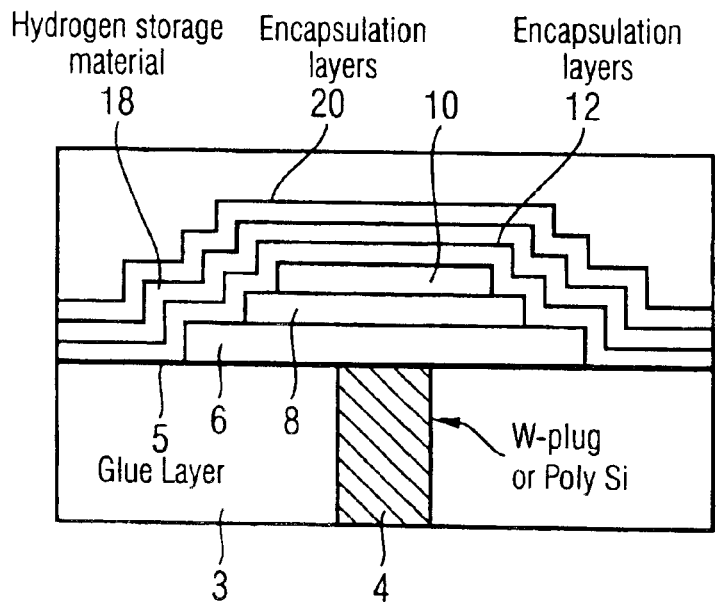
FIG. 3 is a schematic cross-sectional view of a capacitor according to an embodiment of the present invention showing the application of further encapsulation layers to the device of FIG. 2b.

FIGS. 2a to 3 show the various processing stages of a device such as a ferroelectric capacitor, according to a preferred embodiment of the present invention, resulting in the processed device of FIG. 3.

FIG. 2a shows the first stage in the production process of a capacitor device 2 for inhibiting hydrogen damage to the capacitor. The same reference numerals as those used in FIG. 1 have been used in FIGS. 2a to 3 to denote the same components. In FIG. 2a, one or more encapsulation layers 12 are shown covering the capacitor 2. The encapsulation layers may be formed, for example, of $Al_2O_3$, $TiO_2$, or $CeO_2$ and may be applied using a deposition technique such as sputtering.

FIG. 2b shows the next stage in the process according to the invention. One or more layers 18 of a hydrogen storage material are applied over the encapsulation layer(s) 12 to cover the device 2. The hydrogen storage material may be, for example, LaNix [1], $Ti_{45}Zr_{38}Ni_{171}$-phase [2], or amorphous Sm—Co [3]. A number of hydrogen storage material layers 18 may be applied over one another to the encapsulation layer(s) 12, and each of these layers 18 may be formed of different hydrogen storage materials.

FIG. 3 shows the next stage in the production process which involves the deposition of one or more further encapsulation layers 20 applied to the hydrogen storage material layer(s) 18. After deposition of the further encapsulating layer(s) 20, the manufacturing process continues in the conventional way to form the contact windows (not shown). The further encapsulation layer(s) 20 may be formed of, for example, $Si_3N_4$, or $Al_2O_3$, or any one or more of $TiO_2$, $HfO_2$, $ZrO_2$, $CeO_2$ and/or their silicates. The addition of the further encapsulation layer(s) 20 is particularly advantageous as it enhances the resistance to hydrogen diffusion.

The further encapsulation layer(s) 20 may be applied using a deposition technique such as atomic layer deposition (ALD) or chemical vapour deposition (CVD). The techniques of applying the encapsulation layers 12 and 20, for example, sputtering, do not generally result in the release of hydrogen ions which could cause damage to the ferroelectric layer 8 and/or electrodes 10,6.

From the above description, it will be seen that the top electrode 10 and the ferroelectric layers 8 are protected from hydrogen damage by the hydrogen storage material layer(s) 18 which serve to absorb the hydrogen.

The systems and methods according to the present invention may be particularly useful in the production of devices for use, for example, as ferroelectric random access memories.

Various modifications to the embodiments of the present invention described above may be made. For example, other materials and method steps can be added or substituted for those above. Thus, although the invention has been described above using particular embodiments, many variations are possible within the scope of the claims, as will be clear to the skilled reader, without departing from the spirit and scope of the invention.

What is claimed is:

1. A device comprising:
   a substrate;
   a contact plug passing through said substrate;
   a first electrode formed on said substrate, said first electrode being electrically connected to said plug;
   a ferroelectric layer formed on said first electrode;
   a second electrode formed on said ferroelectric layer;
   one or more first encapsulation layers on said second electrode, said one or more encapsulation layers extending over said device; and
   plurality of hydrogen storage material layers on said one or more encapsulation layers.

2. The device of claim 1, further comprising one or more second encapsulation layers formed on said plurality of hydrogen storage material layers.

3. The device of claim 1, further comprising a glue layer between said first electrode and said ferroelectric layer.

4. The device of claim 1, wherein any one of said plurality of hydrogen storage material layers comprises $LaNi_x$, $Ti_{45}Zr_{38}Ni_{171}$-phase, or amorphous Sm—Co.

5. The device of claim 1, wherein any one of said one or more first encapsulation layers comprises $Si_3N_4$, or $Al_2O_3$.

6. The device of claim 1, wherein any one of said one or more first encapsulation layers comprises $TiO_2$, $HfO_2$, $ZrO_2$, or $CeO_2$, or any one of their silicates.

7. The device of claim 2, wherein any one of said one or more second encapsulation layers comprises $Si_3N_4$, or $Al_2O_3$.

8. The device of claim 2, wherein any one of said second one or more encapsulation layers comprises $TiO_2$, $HfO_2$, $ZrO_2$, or $CeO_2$, or any one of their silicates.

9. A ferroelectric capacitor device comprising the device of claim 1.

10. A ferroelectric Random Access Memory device comprising one or more devices according to claim 1.

11. The device of claim 1, wherein each of the plurality of hydrogen material layers is formed of a different hydrogen storage material.

* * * * *